(12) United States Patent
Yamagishi et al.

(10) Patent No.: US 7,838,606 B2
(45) Date of Patent: Nov. 23, 2010

(54) PRODUCTION PROCESS OF COPOLYMER FOR SEMICONDUCTOR LITHOGRAPHY

(75) Inventors: Takanori Yamagishi, Funabashi (JP); Ichiro Kato, Chiba (JP); Satoshi Yamaguchi, Ichihara (JP)

(73) Assignee: Maruzen Petrochemical Co., Ltd, Tokyo (JP)

(*) Notice: Subject to any disclaimer, the term of this patent is extended or adjusted under 35 U.S.C. 154(b) by 0 days.

(21) Appl. No.: 10/929,594

(22) Filed: Aug. 31, 2004

(65) Prior Publication Data

US 2005/0096447 A1 May 5, 2005

(30) Foreign Application Priority Data

Oct. 30, 2003 (JP) ............... 2003-371089

(51) Int. Cl.
 *C08F 2/00* (2006.01)
 *C08F 118/02* (2006.01)
(52) U.S. Cl. ................. 526/72; 526/319
(58) Field of Classification Search ......... 526/319, 526/72
See application file for complete search history.

(56) References Cited

U.S. PATENT DOCUMENTS

| | | | | |
|---|---|---|---|---|
| 2,202,055 A | * | 5/1940 | Juffa | 210/336 |
| 4,212,848 A | * | 7/1980 | Boehme et al. | 422/267 |
| 5,662,805 A | * | 9/1997 | Cameron et al. | 210/709 |
| 6,730,762 B2 | * | 5/2004 | Lousenberg et al. | 526/250 |

FOREIGN PATENT DOCUMENTS

| | | |
|---|---|---|
| JP | 59-45439 | 3/1984 |
| JP | 62-115440 | 5/1987 |
| JP | 3-223860 | 10/1991 |
| JP | 4-104251 | 4/1992 |
| JP | 4-219757 | 8/1992 |
| JP | 5-113667 | 5/1993 |
| JP | 7-209868 | 8/1995 |
| JP | 9-73173 | 3/1997 |
| JP | 10-239846 | 9/1998 |
| JP | 11-65120 | 3/1999 |
| JP | 2000-313779 | 11/2000 |
| JP | 2001-27810 | 1/2001 |
| JP | 2001-109153 | 4/2001 |
| JP | 2001-192411 | 7/2001 |
| JP | 2001-226324 | 8/2001 |
| JP | 2002-201210 | 7/2002 |
| JP | 2002-229220 | 8/2002 |
| JP | 2003-57828 | 2/2003 |
| JP | 2003-231721 | 8/2003 |

* cited by examiner

*Primary Examiner*—William K Cheung
(74) *Attorney, Agent, or Firm*—Oblon, Spivak, McClelland, Maier & Neustadt, L.L.P.

(57) ABSTRACT

Efficient and reproducible production of a copolymer for lithography, which has stable quality, with little lot-to-lot variations, and is suited for film-forming and coating compositions. Radical polymerization of a monomer, which contains at least one ethylenic double bond, with an initiator, in a solvent, and purification of the reaction mixture by precipitation and filtration, in a hermetically-closable single vessel divided by a filter medium, into a first section provided with fluid feeding means and agitating means, and a second section with fluid drawing means. Feeding the reaction mixture from the fluid feeding means into the first section of the vessel, containing a poor solvent, and contacting the reaction mixture with the poor solvent to precipitate a solid; and filtering the resulting fluid, containing the precipitated solid, through the filter medium, drawing the resultant filtrate through the fluid drawing means, and then separating the precipitated solid.

13 Claims, 1 Drawing Sheet

[FIG.1]
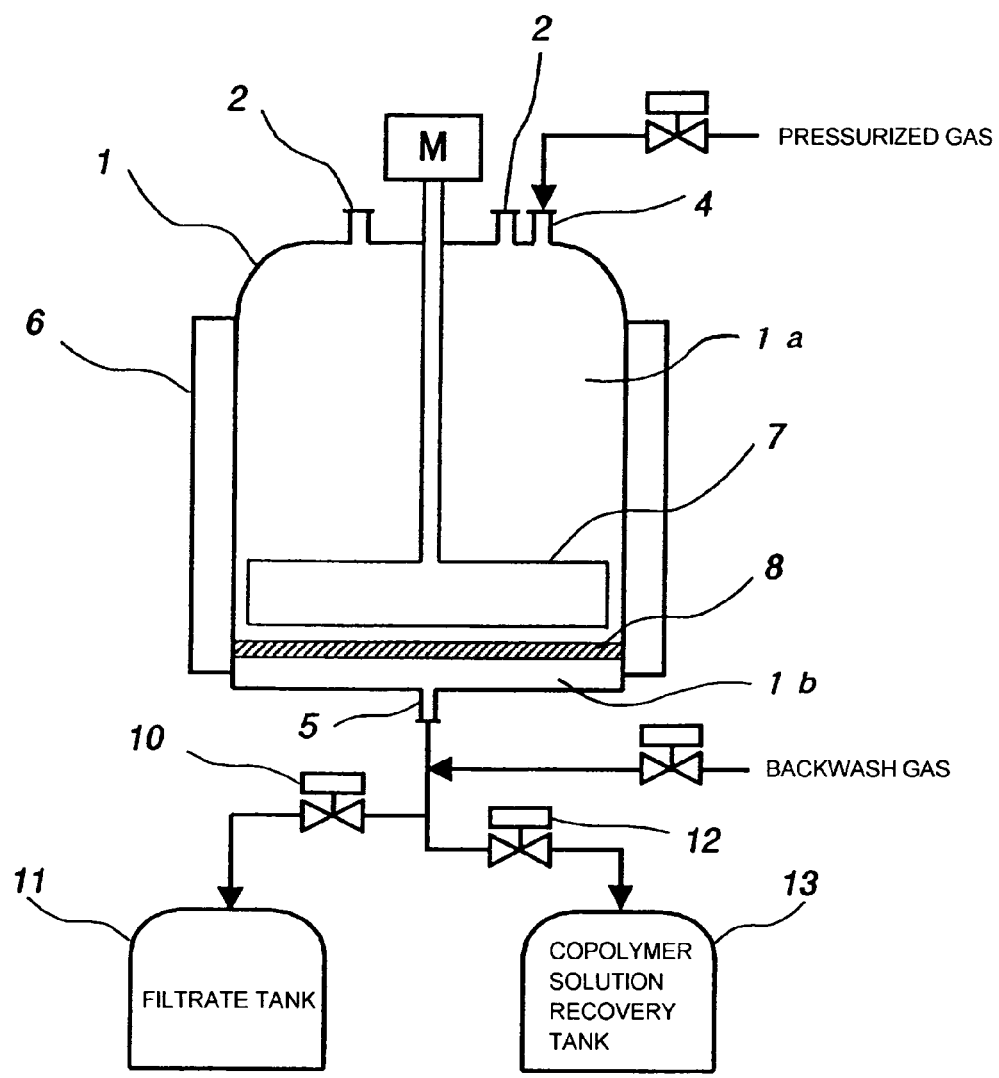

PRODUCTION PROCESS OF COPOLYMER FOR SEMICONDUCTOR LITHOGRAPHY

FIELD OF THE INVENTION

This invention relates to a process of producing a copolymer for semiconductor lithography, which is suited as a film-forming polymer in semiconductor lithography such as a polymer for resists, a polymer for anti-reflective coatings, and a polymer for under layers in multilayer resists, and more specifically, to a process for producing a copolymer for semiconductor lithography by radical polymerization, which comprises causing the copolymer, which has been obtained by the radical polymerization, to precipitate in a poor solvent, and then washing and separating the precipitate.

DESCRIPTION OF THE BACKGROUND

In lithography for the fabrication of semiconductors, the formation of finer patterns is required in step with increases in the degree of integration. For further reductions in pattern size, wavelength shortening of exposure light sources is indispensable. At present, lithography by krypton fluoride (KrF) excimer laser (wavelength: 248 nm) is becoming the mainstream, and lithography of 100 nm or finer feature size by argon fluoride (ArF) excimer laser light (wavelength: 193 nm) is also being put to practical use. Moreover, various short-wavelength radiation lithography techniques using fluorine dimer ($F_2$) excimer laser light (wavelength: 157 nm), extreme ultraviolet (EUV), X-rays, electron beams or the like are also under development.

In such semiconductor lithography, a variety of coating films are used as resist films, each of which serves to form a resist pattern on a substrate by using the property that its solubility to an alkaline developer changes only at exposed areas under the action of an acid generated by light, and also as upper layers or under layers for such resist films. Example of the under layers include anti-reflective coatings for minimizing reflected light from substrates to precisely form resist patterns; planarizing films used as under layers for resist films so that, upon forming additional resist patterns over substrates on which patterns have been formed, the surfaces of the patterned substrates are planarized; and under layers in multilayer resists for transferring resist patterns by dry etching. These coating films are each formed by dissolving a copolymer for lithography, said copolymer being equipped with the function of the corresponding coating film, and other additives in an organic solvent to prepare a coating fluid, and applying the coating fluid to a substrate by a method such as spin coating, and then eliminating the solvent optionally with heat or the like. In addition to optical properties, chemical properties and physical properties, such as coating properties and adherence to under layers, all required for resist films and anti-reflective coatings, these copolymers for lithography are also required to be equipped with fundamental properties as copolymers for coating films such that they are free of particles detrimental to the formation of fine patterns.

Resist polymers include negative-type resist polymers and positive-type resist polymers. A negative-type resist polymer is lowered in its solubility to an alkaline developer under the action of an acid, while a positive-type resist polymer is enhanced in its solubility to an alkaline developer under the action of an acid. A positive-type resist polymer is formed including, as essential components, recurring units contacting nonpolar substituent groups that are removed with an acid to form polar groups soluble to an alkaline developer and recurring units containing polar groups for enhancing the adherence to semiconductor substrates, and if necessary, may also include recurring units that contain polar or nonpolar substituent groups to adjust the solubility to a resist solvent or the alkaline developer. As the recurring units containing polar groups for enhancing the adherence to substrates, hydroxystyrene units or the like are primarily used when a KrF excimer laser is used as an exposure source. When an ArF excimer laser is used, hydroxystyrene type units or the like absorb light of 193 nm wavelength so that (meth)acrylate units containing polar groups are now under investigation.

As known specific examples of such positive-type resist polymers, those useful with the KrF system include copolymers making combined use of acrylic acid monomers and styrene monomers (see, for example, JP-A-59-045439, JP-A-5-113667, JP-A-7-209868 and JP-A-11-065120) and polymers with some of hydroxystyrene units being protected with acetal (see, for example, JP-A-62-115440, JP-A-4-219757, JP-A-3-223860 and JP-A-4-104251), and those useful with the ArF system include copolymers of (meth)acrylic acid monomers having the lactone structure (see, for example, JP-A-9-073173 and JP-A-10-239846).

Known as polymers for anti-reflective coatings are polymers obtained by copolymerizing aromatic-nucleus-containing vinyl compounds such as styrene, styrene derivatives and anthracenylmethyl(meth)acrylate with acrylamide derivatives or hydroxyl- or epoxy-containing vinyl compounds and if necessary with alkyl(meth)acrylates or the like (see, for example, JP-A-2000-313779, JP-A-2001-027810, JP-A-2001-192411 and JP-A-2001-226324). As polymers for planarizing films, are known copolymers of hydroxystyrene with polymerizable compounds such as styrene, alkyl(meth)acrylates, hydroxyalkyl(meth)acrylates and the like (see, for example, JP-A-2003-057828).

If unreacted monomers, polymerization initiators, chain transfer agents, their coupling products or the like, or impurities added or formed upon polymerization reactions remain in copolymers for semiconductor lithography such as these resist polymers and polymers for anti-reflective coatings, they may evaporate and damage aligners in lithography, or during storage as copolymers or in the form of compositions for lithography, they may undergo polymerization to form substances that may cause pattern defects. A purification step is, therefore, needed to eliminate these impurities upon production of the copolymers.

As a purification method for such copolymers, there is known a method in which a polymerization mixture and a poor solvent are mixed to precipitate a solid (see JP-A-2001-109153). This method is, however, accompanied by a problem that impurities such as unreacted monomers cannot be fully eliminated when precipitation is conducted only once. Precipitation may be conducted twice or more, but in such a case, it is necessary to repeatedly perform operations such as precipitation, filtration and dissolution.

As simpler methods, there are hence known methods in which a solid obtained by precipitation is washed and filtered by dispersing it in a poor solvent or a mixed solvent of a poor solvent and a good solvent. Disclosed are, for example, methods in which a solid obtained by precipitation is dispersed in a poor solvent or a mixed solvent of a poor solvent and a good solvent, heated, and then collected by filtration (see JP-A-2002-201210 and JP-A-2002-229220) and a method in which a solid obtained by precipitation is dispersed in a poor solvent, the solvent is removed from the resultant dispersion by a centrifugal separator, a small amount of the poor solvent is added, and the solid is rinsed in the centrifugal separator (see JP-A-2003-231721). The methods in which a solid is dispersed in a solvent and then heated are, however, accompanied by a problem that a portion of the resulting copolymer is dissolved into the solvent and the yield of the copolymer is lowered.

Further, precipitation or washing is generally conducted using a vessel equipped with an agitator that has only a mixing function. Filtration, on the other hand, is conducted using a filter tank having a filter medium, a filter press, a centrifugal filtration apparatus, or the like. Whichever method is employed, it is accordingly necessary to transfer a slurry from a precipitation tank or washing tank to a filter tank after conducting precipitation or washing. When precipitation and washing are conducted repeatedly, it is necessary to once take a filter cake out of a filter tank subsequent to its formation in the filter tank, to dissolve the filter cake, and then to drop or otherwise return the resulting solution into a precipitation or washing tank. These operations involve problems that they are irksome, require many equipment, are inefficient, and further, are vulnerable to contamination from the outside.

In addition, the solid obtained by precipitation and containing the resultant copolymer is generally in the form of fine particles. With a conventional filter apparatus, the resulting filter cake and colloidal polymer deposit on the filter surface so that the filtration rate is reduced, leading to a problem that a long time is needed for each filtering operation. If only the precipitation step is conducted to complete the work in a short time, another problem arises in that impurities cannot be removed fully.

Moreover, the temperature of a slurry tends to fluctuate upon precipitation and washing due to the heat of dissolution into the solvent. During filtration, especially when filtration is conducted under reduced pressure, the temperature of the resulting filter cake tends to drop promptly. According to the conventional methods, however, it is difficult to control the temperature of a filter cake upon precipitation or washing. If the temperature varies in the purification step as described above, the removal rate of low molecular weight substances which are caused to dissolve together with impurities into a precipitation solvent or washing solvent varies. In purification of industrial scale, the properties of the copolymer, such as its weight average molecular weight and molecular weight dispersion, vary lot-to-lot, thereby making it difficult to produce the copolymer with uniform properties and good reproducibility. This causes a further problem that its performance in lithography becomes unstable. These slight differences in properties lead to variations in the characteristics of lithography. With the advance of micro lithography, a desire has therefore arisen for the development of a process for the production of a copolymer having stable quality with little lot-to-lot variations.

SUMMARY OF THE INVENTION

With the foregoing background in view, the present invention has an object to provide a process of producing with high efficiency and good quality reproducibility, a copolymer for lithography, which has stable quality with little lot-to-lot variations and is suited for film-forming compositions such as resist-film-forming compositions useful for forming fine patterns in the fabrication of semiconductors, compositions for forming under layers in multilayer resists, and compositions for forming anti-reflective coatings.

The present inventors have proceeded with an extensive investigation. As a result, it has been found that the above-described problems can also be resolved by conducting specific purification in a particular vessel, leading to the completion of the present invention.

Specifically, the present invention provides a process of producing a copolymer for semiconductor lithography by subjecting a polymerizable monomer, which contains at least one ethylenic double bond, to radical polymerization with a polymerization initiator in the presence of a polymerization solvent. The process comprises purifying a polymerization reaction mixture, which has been obtained by the radical polymerization and contains the copolymer, by the following precipitation and filtration steps (1) and (2) in a hermetically-closable single vessel divided by a filter medium into a first section provided with fluid feeding means and agitating means and a second section provided with fluid drawing means:

(1) a precipitation step of feeding the polymerization reaction mixture from the fluid feeding means into the first section of the vessel, in which a poor solvent has been placed, and contacting the polymerization reaction mixture with the poor solvent to precipitate a solid; and (2) a filtration step of opening the fluid drawing means to draw the resultant filtrate therethrough such that the solid precipitated in the precipitation step (1) is filtered off by the filter medium.

The present invention also provides a process as described above, which further comprises the following washing and filtration steps (3) and (4) after the filtration step (2):

(3) a washing step of closing the fluid drawing means, feeding a poor solvent or a mixed solvent of a poor solvent and a good solvent into the vessel through the fluid feeding means such that the solid, which has been filtered off, is dispersed and washed under agitating; and (4) a filtration step (4) of opening the fluid drawing means to draw the solvent and separating said solid by filtrating said solvent with the solid dispersed therein through the filter medium.

In the above-described processes, at least one of the precipitation and filtration steps and the washing and filtration steps can be conducted preferably in a temperature range of from 0 to 40° C.

In each filtration step, the filtration can preferably be conducted while agitating contents with an impeller, and/or a resulting filter cake of the solid can preferably be spread with the impeller, for example, by reciprocating the impeller up and down, and/or in the course of each filtration step, one of the filtrated solvent or a gas can preferably be caused to flow backward from the second section of the vessel into the first section of the vessel such that any deposit on the filter medium is separated from the filter medium. The filtration can be efficiently performed by conducting it as described above.

According to the present invention, the precipitation and filtration steps and/or the washing and filtration steps can be performed in the single vessel. It is, therefore, unnecessary to transfer a precipitation mixture or washing mixture to a filter tank or to transfer a filter cake to a washing tank or the like. This makes it possible to avoid contamination from the outside and also to perform the purification efficiently. In addition, the obviation of any transfer to another vessel permits rationalization of the equipment and improvements in the efficiency of work.

The agitating, spreading or backwash of the filter cake upon filtration can prevent the filter cake from depositing on the filter surface, so that the filtration period can be shortened significantly. Moreover, these operations allow uniform extraction of the solution from the filter cake, thereby making it possible to efficiently remove impurities such as unreacted-monomers.

The control of the temperature during the precipitation and filtration steps and/or the washing and filtration steps can control constant the removal rate of low molecular weight substances which dissolve out together with impurities. It is, therefore, possible to obtain the copolymer for semiconductor lithography with stable quality i.e., with little lot-to-lot variations, and accordingly, to achieve improved performance in lithography.

BRIEF DESCRIPTION OF THE DRAWING

FIG. 1 is a simplified schematic illustration showing one example of a vessel, which is suitable as a vessel equipped with a mixing function and useful in the steps of the present invention.

DETAILED DESCRIPTION OF THE INVENTION AND PREFERRED EMBODIMENTS

As a feed monomer for use in radical polymerization upon production of a copolymer for semiconductor lithography in the present invention, any monomer can be generally used without any particular limitation insofar as it is a polymerizable compound (monomer) containing at least one ethylenic double bond and useful for the production of a resist polymer, an under layer polymer in a multilayer resist or an anti-reflective coating polymer.

A copolymer useful as a positive-type resist polymer is formed including, as essential components, at least recurring units (A) of a chemical structure which is decomposed with an acid and becomes soluble to an alkaline developer, more specifically recurring units of a chemical structure in which nonpolar substituent groups are removed with the acid to form polar groups soluble to the alkaline developer and recurring units (B) containing polar groups for enhancing the adherence to semiconductor substrates, and if necessary, may also include recurring units (C) that contain polar or nonpolar substituent groups to adjust the solubility to a resist solvent or the alkaline developer.

The recurring units (A), which are decomposed with the acid and become soluble to alkali, mean the chemical structure that has been used widely as resists to date. They can be obtained by polymerizing a monomer having a chemical structure which is decomposed with the acid and becomes soluble to alkali, or by polymerizing a monomer having an alkali-soluble chemical structure and protecting substituent groups (alkali-soluble groups), each of which are contained in the alkali-soluble chemical structure, with groups (acid-labile protecting groups) which are not soluble to alkali but are removed with the acid.

Examples of the monomer having the chemical structure, which is decomposed with the acid and becomes soluble to alkali, include compounds formed by bonding acid-labile protecting groups to polymerizable compounds containing alkali-soluble substituent groups, for instance, compounds containing phenolic hydroxyl, carboxyl or hydroxyfluoroalkyl groups which are protected by nonpolar, acid-labile protecting groups.

Illustrative are hydroxystyrenes such as p-hydroxystyrene, m-hydroxystyrene and p-hydroxy-α-methylstyrene; carboxylic acids containing at least one ethylenic double bond, such as acrylic acid, methacrylic acid, maleic acid, fumaric acid, α-trifluoromethylacrylic acid, 5-norbornene-2-carboxylic acid, 2-trifluoromethyl-5-norbornene-2-carboxylic acid, and carboxytetracyclo[4.4.0.1$^{2,5}$.1$^{7,10}$]dodecyl methacrylate; polymerizable compounds containing at least one hydroxyfluoroalkyl group, such as p-(2-hydroxy-1,1,1,3,3,3-hexafluoro-2-propyl)styrene, 2-(4-(2-hydroxy-1,1,1,3,3,3-hexafluoro-2-propy)cyclohexyl)-1,1,1,3,3,3-hexafluoropropyl acrylate, 2 (4 (2 hydroxy-1,1,1,3,3,3-hexafluoro-2-propyl)cyclohexyl)-1,1,1,3,3,3-hexafluoropropyltrifluoromethyl acrylate and 5-(2-hydroxy-1,1,1,3,3,3-hexafluoro-2-propyl)methyl-2-norbornene.

Examples of the acid-labile protecting groups include saturated hydrocarbon groups such as tert-butyl, tert-amyl, 1-methyl-1-cyclopentyl, 1-ethyl-1-cyclopentyl, 1-methyl-1-cyclohexyl, 1-ethyl-1-cyclohexyl, 2-methyl-2-adamantyl, 2-ethyl-2-adamantyl, 2-propyl-2-adamantyl, 2-(1-adamantyl)-2-propyl, 8-methyl-8-tricyclo[5.2.1.0$^{2,6}$]decanyl, 8-ethyl-8-tricyclo[5.2.1.0$^{2,6}$]decanyl, 8-methyl-8-tetracyclo[4.4.0.1$^{2,5}$.1$^{7,10}$]dodecanyl, and 8-ethyl-8-tetracyclo[4.4.0.1$^{2,5}$.1$^{7,10}$]dodecanyl; and oxygen-containing hydrocarbon groups such as 1-methoxyethyl, 2-ethoxyethyl, 1-isopropoxyethyl, 1 n-butoxyethyl, 1-tert-butoxyethyl, 1-cyclopentyloxyethyl, 1-cyclohexyloxyethyl, 1-tricyclo[5.2.1.0.$^{2,6}$]decanyloxyethyl, methoxymethyl, ethoxymethyl, iso-propoxymethyl, n-butoxymethyl, tert-butoxymethyl, cyclopentyloxymethyl, cyclohexyloxymethyl, tricyclo[5.2.1.0$^{2,6}$]decanyloxymethyl, and tert-butoxycarbonyl.

To protect the alkali-soluble group in each alkali-soluble chemical structure with an acid-labile protecting group subsequent to the polymerization of the monomer having the alkali-soluble chemical structure, the compound with the alkali-soluble group contained therein is used as is for the polymerization reaction, and the resulting polymer is then reacted with a compound, which can generate an alkali-insoluble substituent group, such as vinyl ether or a halogenated alkyl ether in the presence of an acid catalyst. This has made it possible to introduce acid-labile protecting groups in the polymer. Examples of the acid catalyst used in the reaction include p-toluenesulfonic acid, trifluoroacetic acid, and strong acid ion exchange resins.

On the other hand, examples of the monomer capable of forming recurring units (B), which contain polar groups for enhancing the adherence to semiconductor substrates, include compounds containing one or more phenolic hydroxyl group, carboxyl group or hydroxyfluoroalkyl groups as polar groups. More specific examples include the above-described hydroxystyrenes as polymerizable compounds containing one or more alkali-soluble groups, carboxylic acids containing one or more ethylenic double bonds, and polymerizable compounds containing one or more hydroxyfluoroalkyl groups; monomers formed by substituting such compounds with one or more polar groups; and further, monomers with one or more polar groups bonded on their alicyclic structures such as norbornene ring or tetracyclododecene ring structures.

As the polar groups introduced as substituent groups in the recurring units (B), those containing the lactone structure are particularly preferred. Illustrative are substituent groups containing the lactone structure, such as residual groups of γ-butyrolactone, γ-valerolactone, δ-valerolactone, 1,3-cyclohexanecarbolactone, 2,6-norbornanecarbolactone, 4-oxatricyclo[5.2.1.0$^{2,6}$]decan-3-one, and δ-lactone mevalonate. As polar groups having no lactone structure, hydroxyalkyl groups such as hydroxymethyl, hydroxyethyl, hydroxypropyl and 3-hydroxy-1-adamantyl can also be mentioned, for example.

Examples of monomers capable of forming the recurring units (C), which may be contained as needed and contain nonpolar substituent groups for adjusting the solubility to a resist solvent or an alkaline developer, include aromatic compounds containing one or more ethylenic double bonds, such as styrene, α-methylstyrene, p-methylstyrene and indene; ester compounds formed by esterifying carboxylic acids with one or more acid-stable nonpolar groups containing one or more ethylenic double bonds such as acrylic acid, methacrylic acid, trifluoromethylacrylic acid, norbornenecarboxylic acid, 2-trifluoromethylnorbornenecarboxylic acid and carboxytetracyclo[4.4.0.1$^{2,5}$.1$^{7,10}$]dodecyl methacrylic acid; and alicyclic hydrocarbon compounds containing one or more ethylenic double bonds, such as norbornene and tetracyclododecene. On the other hand, examples of the acid-stable nonpolar groups, which esterify the carboxylic acids, include methyl, ethyl, cyclopentyl, cyclohexyl, isobornyl, tricyclo[5.2.1.0$^{2,6}$]decanyl, 2-adamantyl, and tetracyclo [4.4.0.1$^{2,5}$.1$^{7,10}$]dodecyl.

With respect to each type of the recurring units (A), (B) and (C), the above-exemplified monomers can be used either singly or in combination. The proportion of each type of the recurring units in the resulting resist polymer can be selectively determined within a range not impairing the basic performance of the polymer as a resist. In general, the proportion of the recurring units (A) may preferably be from 10 to 70 mole %, with from 10 to 60 mole % being more preferred. The proportion of the recurring units (B), on the other hand, may preferably be from 30 to 90 mole %, with from 40 to 90 mole % being more preferred, although a proportion of 70 mole % or lower is preferred where a monomer unit contains two or more identical polar groups. Further, the proportion of the recurring units (C) may preferably be from 0 to 50 mole %, and more preferably, it is desired to select their proportion within a range of from 0 to 40 mole %.

Employed as a copolymer for an under layer coating film in a multilayer resist or for an anti-reflective coating, on the other hand, is a polymer of a chemical structure similar to the chemical structure of the copolymer as the polymer for positive-type resists except for the deletion of the recurring units (A) which are decomposed with an acid and become soluble to alkali. The proportions of the individual types of recurring units in the copolymer cannot be specified in a wholesale manner because they differ depending on the application purpose of the coating film. In general, however, the proportion of the recurring units (B) can be selected from the range of from 10 to 100 mole %, while the proportion of the recurring units (C) can be selected from the range of from 0 to 90%.

Further, a copolymer to be employed as anti-reflective coatings is required to contain crosslinking points and also chemical structures which absorb radiation applied in photolithography. The crosslinking points can be reactive substituent groups which are crosslinkable via ester bonds, urethane bonds or the like, such as hydroxyl groups, amino groups, carboxyl groups or epoxy groups. As monomers containing one or more reactive substituent groups which can serve as crosslinking point or points, hydroxystyrenes such as p-hydroxystyrene and m-hydroxystyrene as well as monomers with one or more reactive substituent groups such as hydroxyl, amino, carboxyl and/or epoxy groups substituted on the above-exemplified polymerizable compounds can be used as desired.

The chemical structures which absorb radiation differ depending on the wavelength of the radiation to be used. For ArF excimer laser light, for example, chemical structures containing a benzene ring or an analogue thereof can be used suitably. Illustrative of a monomer containing such a chemical structure are styrenes and derivatives thereof, such as styrene, α-methylstyrene, p-methylstyrene, p-hydroxystyrene and m-hydroxystyrene; aromatic-ring-containing esters having one or more ethylenic double bonds, such as substituted or unsubstituted phenyl(meth)acrylate, substituted or unsubstituted naphthalenyl(meth)acrylate, and substituted or unsubstituted anthracenylmethyl(meth)acrylate. This monomer with the radiation-absorbing chemical structure contained therein can be introduced either as the recurring units (B) or as the recurring units (C) depending upon whether it contains one or more polar groups or not. The proportion of the monomer with the radiation-absorbing chemical structure contained therein is selected preferably from a range of from 10 to 100 mole %.

A description will next be made about the manner of polymerization of the copolymer for semiconductor lithography. In the present invention, it is preferred to obtain the copolymer by subjecting two or more polymerizable compounds, which are selected from the above-described group of monomers, to radical polymerization in the presence of a polymerization solvent while using a polymerization initiator.

No particular limitation is imposed on the polymerization initiator for use in the polymerization reaction insofar as it is generally used as a radical generator. For example, azo compounds such as 2,2'-azobisisobutyronitrile, 2,2'-azobis(2-methylbutyronitrile), dimethyl 2,2'-azobisisobutyrate, 1,1'-azobis(cyclohexane-1-carbonitrile) and 4,4'-azobis(4-cyanovaleric acid) and organic peroxides such as decanoyl peroxide, lauroyl peroxide, benzoyl peroxide, bis(3,5,5-trimethylhexanoyl) peroxide, succinic acid peroxide and tert-butyl peroxy-2-ethylhexanoate can be used either singly or in combination.

It is not particularly needed to use a chain transfer agent. However, known thiol compounds, for example, such as dodecyl mercaptan, mercaptoethanol, mercaptopropanol, mercaptoacetic acid, mercaptopropionic acid and 4,4-bis(trifluoromethyl)-4-hydroxy-1-mercaptobutane can be used either singly or in combination.

The amounts of the polymerization initiator and chain transfer agent differ depending upon the kinds of the feed monomers, polymerization initiator and chain transfer agent to be used in the polymerization reaction and the production conditions such as the polymerization temperature, polymerization solvent, polymerization process, purifying conditions and the like, and therefore, cannot be specified in any wholesale manner. They should, however, be used in amounts optimal for the achievement of a desired molecular weight. In general, a copolymer with an unduly high weight average molecular weight leads to a low solubility to a solvent to be used upon formation of a coating film and also to an alkaline developer, while a copolymer with an excessively low weight average molecular weight results in a coating film of deteriorated performance. It is, therefore, preferred to adjust the production conditions to achieve a weight average molecular weight in a range of from 2,000 to 40,000, with a range of from 3,000 to 30,000 being more preferred.

As a polymerization process upon production of the copolymer, solution polymerization is preferred. It is preferred to subject feed monomers, a polymerization initiator, and if necessary, a chain transfer agent to radical copolymerization in a state that they are dissolved in a polymerization solvent. The solution polymerization can be practiced, for example, by a so-called batch polymerization process in which all the monomers, the polymerization initiator, and if necessary, the chain transfer agent are dissolved in the polymerization solvent and are then heated to a polymerization temperature or by a so-called dropwise polymerization process in which the monomers, polymerization initiator and chain transfer agent are added as a single or plural mixtures or independently into a polymerization system heated at a polymerization temperature. Of these, the dropwise polymerization process is suited for its capability of reducing lot-to-lot variations. It is particularly preferred to separately hold and drop the monomers and the polymerization initiator from the standpoint of holding the undropped monomers stably during the dropping time.

No particular limitation is imposed on the solvent for use in the polymerization reaction, insofar as it can stably dissolve the feed monomers, the resulting copolymer, the polymerization initiator, and the chain transfer agent. Specific examples of the polymerization solvent include ketones such as acetone, methyl ethyl ketone, methyl amyl ketone and cyclohexanone; ethers such as tetrahydrofuran, dioxane, glyme and propylene glycol monomethyl ether; esters such as ethyl acetate and ethyl lactate; ether esters such as propylene glycol methyl ether acetate; and lactones such as γ-butyrolactone. They can be used either singly or in combination. No particular limitation is imposed on the amount of the polymerization solvent. In general, however, the polymerization solvent is used in an amount of from 0.5 to 20 parts by weight, preferably from 1 to 10 parts by weight per part by weight of the monomers. Use of the solvent in an unduly small amount may result in the precipitation of one or both of the monomers or an excessively high viscosity so that the polymerization system may no longer be maintained homogeneous. Use of the solvent in an unduly large amount, on the other hand, may fail in achieving any sufficient conversions of the monomers or in raising the molecular weight of the resulting copolymer to any desired value.

No particular limitations are imposed on the reaction conditions for the polymerization. In general, however, the reaction temperature may preferably be from 60° C. to 100° C. or so. To produce the copolymer with reduced lot-to-lot variations, strict control of the polymerization temperature is needed. It is preferred to control the polymerization temperature within ±1° C. of the preset temperature.

Concerning the reaction time, a longer dropping time is preferred in the case of dropwise polymerization, because the longer dropping time can keep constant the composition and concentrations of the monomers and the concentration of radicals in the polymerization system so that the composition and molecular weight of the polymer formed during the dropping time are facilitated to become uniform. However, an unduly long dropping time is not preferred from the standpoint of the production efficiency per unit time and the stability of the monomers until they are dropped. Accordingly, the dropping time may be selected from a range of from 0.5 to 20 hours, preferably from 1 to 10 hours. Subsequent to the completion of the dropwise addition, because the unreacted monomers are still remaining, it is preferred to conduct aging for a certain time while maintaining the polymerization temperature. The aging time may be selected from a range of 8 hours and shorter, preferably from a range of from 1 to 6 hours. In the case of batch polymerization, on the other hand, the aging time after the polymerization temperature has been reached may be selected from a range of from 1 to 24 hours, preferably from 2 to 12 hours.

The present invention is characterized in that a copolymer for semiconductor lithography is obtained by the steps of contacting a polymerization reaction mixture, which has been obtained by the above-described polymerization reaction, with a poor solvent to precipitate a solid and then separating the precipitated solid from the solvent by filtration (precipitation and filtration steps) and also in that the solid obtained by the precipitation and filtration steps is purified by removing unnecessary substances such as the unreacted monomers, oligomers, the polymerization initiator, the chain transfer agent and other reaction residues through the steps of dispersing it again in a poor solvent or a mixed solvent of a poor solvent and good solvent to wash the same and then separating it from the solvent by filtration (washing and filtration steps).

The present invention is characterized in that the precipitation and filtration steps and/or the washing and filtration steps are conducted in a hermetically-closable single vessel which, as will be described subsequently herein by way of example with reference to FIG. 1, is divided by a filter medium into a first section provided with fluid feeding means and agitating means and a second section provided with fluid drawing means.

The filter medium divides the vessel into the first section and the second section, and serves to filter off a solid from a liquid mixture contained in the first section. Preferably, the filter medium is arranged in the vicinity of a bottom part of the vessel or on a side wall of the vessel. The second section divided by the filter medium is necessarily provided with the means for withdrawing a solvent, for example, a valve and a pump. Owing to the use of such a vessel, the present invention has made it possible to conduct the precipitation and filtration steps and/or the washing and filtration steps with the single vessel without needing to transfer the contents.

The agitating means arranged in the vessel may preferably be an impeller, although no particular limitation is imposed thereon. For example, the impeller arranged in the vessel is preferred to be movable up and down and have a shape capable of pressing a filter cake, and in particular, more preferred to be equipped with a reversible drive unit. The use of such an impeller makes it possible to agitate a slurry in each of the precipitation and filtration steps and the washing and filtration steps, so that the separation of the copolymer from impurities can be efficiently performed.

Moreover, the use of the impeller also makes it possible to perform the removal of the impurities and solvent from the filter cake more effectively. Described specifically, as the filtration proceeds and the solvent is progressively extracted from the filter cake, the filter cake develops cracks and the flow of the solvent becomes localized. As a consequence, the efficiency of removal of the solvent and impurities from the whole filter cake deteriorates. Owing to the arrangement of the impeller, especially when the impeller is movable up and down, has a shape capable of performing pressing and/or is reversible, the whole filter cake can be agitated to promote uniform filtration, for example, by spreading the filter cake to avoid cracking or by causing the impeller to enter the filter cake and reversing it.

In addition, agitating of the slurry and filter cake during the filtration makes it possible to prevent a solid from depositing on the filter surface so that the filtration can be completed in a shorter period than conducting the filtration without agitating.

The filter medium arranged in the vessel can preferably be a filter fabric or perforated plate, which does not allow passing of the solid but allows passing of the filtrate and is made of a material from which substances are dissolved as little as possible into the used solvent. Examples of such a filter fabric or perforated plate include synthetic fabrics made of polyester fiber, nylon fiber, polyolefin fiber, aramid fiber, acrylic fiber, fluorinated polyolefin fiber (for example, TEFLON™), polyphenylene sulfide fiber and polyimide fiber; and sintered metals.

To efficiently perform the filtration, the fabrics and sintered metals may preferably have an air permeability of from 0.1 to 300 $cm^3/cm^2 \cdot sec$, with an air permeability of from 0.5 to 100 $cm^3/cm^2 \cdot sec$ being particularly preferred. Usually, the filter medium and the filtrate drawing port are arranged preferably on the bottom part or side wall of the vessel, especially on the bottom part.

Further, the temperatures of the precipitation and filtration steps and washing and filtration steps need to be strictly controlled, because they give significant influence on the molecular weight and molecular weight distribution of the copolymer for lithography, the removal rate of impurities such as the remaining monomers and the initiator residue, and various characteristics in lithography. The use of such a vessel also permits to control the temperature of each filtration step.

In each step, an unduly low temperature is not efficient because the solubility of impurities to the precipitation solvent or washing solvent becomes insufficient and the removal of the impurities cannot be performed sufficiently, while use of an excessively high temperature is not preferred because the copolymer is dissolved in the precipitation solvent or washing solvent and the yield of the copolymer declines. It is, therefore, preferred to conduct each step within a temperature range of from 0 to 40° C., more preferably from 0 to 30° C. As the use of such a vessel makes it possible to systematically control the temperatures of the precipitation and filtration steps and those of the washing and filtration steps, the removal of impurities can be performed with good reproducibility to reduce lot-to-lot variations.

It is also required to always maintain the temperature of each step constant despite temperature variations due to heat of dissolution, heat of vaporization and the like. Temperature variations in each step may preferably be controlled within a range of 10° C. Especially to reduce the lot-to-lot variations, it is preferred to control them within 5° C.

No particular limitation is imposed on the method of temperature control to be performed in the present invention, insofar as it can control the temperature variations to the above-described temperature range. For example, the temperature within the vessel in the purification step can be controlled by temperature-controllable equipment arranged inside or outside the vessel, the vessel can be thermally insulated with a heat insulating material or the like, or these methods can be used in combination. As a specific method that makes use of the temperature-controllable equipment, a temperature control jacket or trace piping is arranged on the outer wall of the vessel, and a heating medium or cooling medium is caused to flow therethrough for performing the temperature control; or an impeller or the like is formed into such a structure as permitting feeding a heating medium or cooling medium therethrough to conduct the temperature control. Conventional heating medium or cooling medium usable within the above-described temperature range include ethylene glycol and a liquid mixed of ethylene glycol and water. If the entire process is performed within a temperature range in which no freezing takes place, water alone can be used. Whichever temperature control method is used, the poor solvent or good solvent to be charged into the vessel in each step may preferably be charged after heating or cooling it to the purification temperature in advance by a temperature-controllable vessel or a heat exchanger.

It is also preferred that the interior of such a vessel can be pressurized or depressurized. Use of such a vessel can efficiently perform filtration under pressure or reduced pressure. In addition, the use of such a vessel can reverse the first section and the second section in pressure during filtration to cause the filtrate to flow backward or can feed a gas such as air or nitrogen to backwash the filter medium. This can fly up substances as a cause of clogging the filter medium, such as colloidal polymer, so that the filtering characteristics can be improved to shorten the filtering time.

Examples of a vessel equipped with an impeller, a filter medium and the like as described above include a filter dryer manufactured by Shinko Pantec Co., Ltd., a "WD Filter" (trade name) manufactured by Nissen Corporation, and a filter dryer manufactured by TANABE WILLTEC INC. These vessels are usable.

Referring next to FIG. 1 which illustrates one example of a vessel suitable for practicing the process of the present invention, the individual steps will be described in more detail.

In the drawing, numeral 1 designates a vessel for conducting precipitation or washing. The vessel is provided in an upper part of a first section 1a thereof with fluid feeding means 2 and a pressurized gas inlet 4, and is also provided in a lower part of a second section 1b thereof with fluid withdrawing means 5. The fluid drawing withdrawing means 5 functions specifically as a filtrate withdrawing port, as a copolymer solution discharge port and also a backwash gas inlet. On an outer wall of the vessel 1, a heating medium or a cooling medium jacket 6 is arranged such that it covers the vessel, and an impeller is arranged as agitating means 7 in the vessel 1.

Further, the vessel 1 is divided by a filter medium 8 into the first section 1a and the second section 1b. To the fluid drawing withdrawing means 5, a filtrate tank 11 is connected via a directional control valve 10 and a copolymer solution recovery tank 13 is also connected via another directional control valve.

In the precipitation and filtration steps, a precipitation solvent, which is composed of a poor solvent and is controlled at 0 to 40° C., desirably at 0 to 30° C., is introduced through one of the fluid feeding means 2, and while maintaining internal temperature variations of the vessel 1 within 10° C., desirably 5° C., a polymerization reaction mixture is continuously or intermittently fed through the other fluid feeding means 2 to precipitate a solid. As the polymerization reaction mixture, a reaction mixture drawn out of a polymerization tank can be fed as is or if necessary, after additionally mixing a good solvent to adjust its solubility. During the precipitation step, the interior of the vessel 1 is agitated by the impeller 7 such that the resulting solid is sufficiently dispersed.

A pressurized gas such as air or nitrogen is then introduced from the pressurized gas inlet 4 into the vessel 1 to perform filtration under pressure. During the filtration, the interior of the vessel 1 is agitated to disperse the resulting solid such that the copolymer and impurities are efficiently separated from each other and temperature differences within the vessel 1 are maintained within 10° C., desirably within 5° C. At a stage that the filtration has proceeded to a certain extent, the impeller can be moved up and down to spread the resulting filter cake such that cracking can be avoided, or the impeller is caused to enter the resulting filter cake and is then reversed. This makes it possible to agitate the whole filter cake and to promote uniform filtration. By agitating the slurry under filtration and the resulting filter cake, it is possible to prevent a solid from depositing on the filter surface and hence, to complete the filtration in a shorter period than conducting the filtration without agitating.

If necessary, a backwash gas such as air or nitrogen can be introduced, the second section 1b of the vessel can be pressurized to cause the filtrate to flow backward into the first section 1a of the vessel, or a backwash gas can be fed through the vessel 1. This can fly up causative substances, such as a colloidal polymer, which would otherwise cause plugging of the filter medium 8, thereby improving the filtering characteristics and shortening the period required for the filtration.

The filtrate which has passed through the filter medium 8 is collected in the filtrate tank 11 via the directional control valve 10.

In the washing and filtration steps, the following operations are next performed continuously on the solid obtained in the above-described steps and still remaining in the vessel 1. Described specifically, a washing solvent composed of a poor solvent or a mixed solvent of a poor solvent and a good solvent and controlled at 0 to 40° C., desirably at 0 to 30° C. is introduced into the vessel 1, and the solid is dispersed with agitating. At this time, it is preferred to control internal temperature differences of the vessel 1 within 10° C., desirably within 50° C. After the solid has been dispersed sufficiently, the solid and the washing solvent are separated from each other by filtration with continued agitating by a similar procedure as in the precipitation and filtration steps.

Washing can be repeated if necessary. In such a case, a washing solvent composed of a poor solvent or a mixed solvent of a poor solvent and a good solvent and controlled at 0 to 40° C., desirably at 0 to 30° C. is introduced again into the vessel 1, and the above-described operations are repeated.

After the purification, the resulting solid can be taken out as is. As an alternative, the solid may be dissolved in a good solvent, caused to pass through the filter medium 8, and then recovered in the copolymer solution recovery tank 13 via the directional control valve 12.

No particular limitation is imposed on the good solvent for use in each step, insofar as it can dissolve not only the copolymer but also the unreacted monomers, oligomers, the polymerization initiator, the chain transfer agent, and coupling reaction products thereof. From the standpoint of control of the production steps, however, it is preferred to use the same solvent as the polymerization solvent described above. No particular limitation is imposed either on the poor solvent, insofar as it can precipitate the copolymer. Illustrative are water; alcohols such as methanol and isopropanol; saturated hydrocarbons such as hexane and heptane; and their mixed solvents. In each step, the good solvent or poor solvent can be used singly, or as an alternative, the good solvent and poor solvent can be used as a mixture in order to adequately control the solubility to the copolymer, monomers, oligomers, polymerization initiator, chain transfer agent or their coupling products.

The amount of the poor solvent to be used in the precipitation and filtration steps is appropriately set depending upon the polymerization solvent used upon polymerization, the amount and kind of the good solvent mixed in the polymerization solvent, and the kind of the precipitation solvent. Based on the total amount of the polymerization reaction mixture and the added good solvent, the poor solvent can be used as much as from 0.5 to 50 times, preferably from 1 to 20 times, more preferably from 2 to 10 times by weight. The amount of the poor solvent or the mixed solvent of the poor solvent and good solvent to be used in the washing and filtration steps, on the other hand, can be from 0.1 to 50 times, preferably from 0.2 to 20 times, more preferably from 0.5 to 10 times by weight as much as the total amount of the polymerization reaction mixture and the added good solvent. Whichever the steps may be, use of the solvent in an unduly small amount leads to insufficient separation of impurities such as the unreacted monomers, polymerization initiator, chain transfer agent or their coupling products, while use of the solvent in an excessively large amount leads to an increase in waste liquid. It is, therefore, not preferred to use the solvent in any amount outside the above range from the standpoint of workability and cost.

The precipitation and filtration steps are conducted at least once to precipitate the solid from the polymerization reaction mixture. However, they can be repeated more than once as needed. The work involving the repetition of the precipitation and filtration is, however, not preferred from the standpoint of contamination avoidance and work efficiency, because the solid or a solution with the solid dissolved in a good solvent has to be discharged out of the vessel once. However, this work is effective for lowering the impurity level of the solid.

No limitation is imposed on the number of repetitions of the washing and filtration steps insofar as impurities can be lowered to a certain level. If impurities have been sufficiently removed by conducting the precipitation and filtration steps, it is possible even to omit the washing and filtration steps. In general, however, it is preferred to conduct the washing and filtration steps once or more, more preferably twice or more.

Upon choosing the kind and amount of the solvent and the number of repetitions in each of the precipitation and filtration steps and the washing and filtration steps, it is preferred to choose conditions in view of the solubility of the copolymer and impurities at the preset temperature such that the remaining monomers will be reduced to 1 wt. % or less, preferably 0.5 wt. % or less, more preferably 0.2 wt. % or less.

After conducting the purification as described above, the copolymer can be dried and taken out as powder. From the viewpoint of workability and the avoidance of contamination from the outside, however, it is preferred to charge a good solvent to dissolve the copolymer and then to take it out as a solution.

To take out the polymer as powder by drying the same, the filter cake is dried under a gas stream such as nitrogen or air and/or under reduced pressure within the vessel. Here, it is preferred to conduct the drying while agitating the filter cake with the impeller, because this permits efficient drying. To conduct the dissolution, the filter cake obtained in the filtration step can be used as is or after drying it into powder. No particular limitation is imposed on the good solvent to be used for the dissolution. Those exemplified above as polymerization solvents can be used likewise.

A copolymer solution, which has been obtained by drawing it out of the vessel after the dissolution, may preferably be passed through a filter having micropores in order to remove in soluble impurities, metal materials and the like. The average diameter of the micropores can be preferably 0.5 µm or smaller, notably 0.1 µm or smaller. Examples of such filters include filters having an average pore size of 0.5 µm or smaller such as "Zeta Plus™ EC Series" (products of CUNO Incorporated) and "Electropore™ ER Grade" (product of CUNO Incorporated); nylon-made filters having an average pore size of 0.1 µm or smaller such as "Ultipleat™ P-Nylon (product of Nihon Pall Ltd.), "Ultipleat Posidyne™ II" (product of Nihon Pall Ltd.), "Electropore™ IIEF Grade" (product of CUNO Incorporated), and "PhotoSHIELD™" (product of CUNO Incorporated); and polyethylene-made filters having an average pore size of 0.1 µm or smaller such as "Micro-Guard Plus™" (product of Mykrolis Corporation) and "Optimizer™ D" (product of Mykrolis Corporation).

After the purification, the copolymer solution can then be finished into a film-forming solution, for example, by distilling off the solvent, which was used at the time of the purification, under reduced pressure while feeding another solvent useful for the formation of a film. No particular limitation is imposed on the solvent useful for the formation of the film, insofar as it can dissolve the copolymer. In general, the solvent is selected in view of its boiling point, its influence to semiconductor substrates and other coating films, and its absorption of radiation to be used in lithography. Examples of solvents generally usable for the formation of films include propylene glycol methyl ether acetate, ethyl lactate, propylene glycol monomethyl ether, methyl amyl ketone, γ-butyrolactone, and cyclohexanone. The solvent can be used generally in a range of from 1 to 20 parts by weight per part by weight of the copolymer, although no particular limitation is imposed on the amount of the solvent.

When the copolymer is used as a resist polymer, a radiation-sensitive acid generator and an acid diffusion control agent for preventing an acid from diffusing into areas not exposed to radiation, such as a nitrogen-containing compound, can be added further to the film-forming solution to finish it into a resist composition. As the radiation-sensitive acid generator, those employed widely as raw materials for resists, such as onium salt compounds, sulfone compounds, sulfonate ester compounds, sulfonamide compounds and disulfonyl diazomethane compounds are usable. To the resist composition, compounds commonly employed as additives to resists, such as dissolution inhibitors, sensitizers and dyes, can be added as needed. No particular limitation is imposed on the proportions of the individual components (other than the resist solvent) in the resist composition. In general, however, the polymer concentration can be selected from a range of from 10 to 50 wt. %, the radiation-sensitive acid generator from a range of from 0.1 to 10 wt. %, and the acid diffusion control agent from a range of from 0.001 to 10 wt. %.

When the resultant copolymer is used as anti-reflective coatings, the copolymer can be used as a mixture with an isocyanate, amine or epoxy compound which has bi- or higher functionality and can achieve crosslinking with in a single polymer or between polymers.

EXAMPLES

Based on Examples, the present invention will next be described further. However, the present invention is by no means limited to them. The average copolymer compositions of the resultant copolymers were determined based on the results of $^{13}$C-NMR measurements. Further, their weight average molecular weights (hereinafter referred to as "Mw"), number average molecular weights (hereinafter referred to as "Mn"), dispersions Mw/Mn and residual monomer concentrations were determined based on the results of measurements by gel permeation chromatography (GPC).

Example 1

Methyl ethyl ketone (hereinafter abbreviated as "MEK") (68 kg), 5-methacryloyloxy-2,6-norbornanecarbolactone (hereinafter abbreviated as "NLM") (16 kg) and 2-methyl-2-adamantyl methacrylate (hereinafter abbreviated as "MAM") (19 kg) were charged in a nitrogen-purged, feed preparation tank, and were then agitated at 20 to 25° C. to prepare a monomer solution. MEK (3 kg) and dimethyl-2,2'-azobisisobutyrate (0.6 kg) were charged in a nitrogen-purged polyethylene tank, and were then agitated at 10 to 20° C. to dissolve them into an initiator solution. Further, MEK (35 kg) was charged in a nitrogen-purged polymerization tank and then heated to 80° C. under agitating. The monomer solution and initiator solution, which had been prepared beforehand, were then fed separately at constant rates over 4 hours into the polymerization tank. An aging reaction was conducted for 2 hours while maintaining the polymerization tank at 80° C. even after the completion of the feeding. The polymerization reaction mixture was then allowed to cool down to room temperature.

Into a closed vessel (hereinafter referred to as "agitating vessel") having a temperature-controlling jacket on an outer wall thereof, having a vertically-movable, reversible impeller inside the vessel, provided with a filter bed formed of a polyester-made filter fabric having 3.5 cm$^3$/cm$^2$·sec air permeability and put up in a bottom part of the vessel, and having 1 m$^2$ filter area and 1,200 liters internal capacity, methanol (700 kg) controlled at 15° C. was charged. After that, the polymerization reaction mixture obtained by the above-described polymerization reaction was fed at a constant rate over 30 minutes such that a solid was precipitated to afford a white slurry. After completion of the feeding, agitating was continued as was for 30 minutes.

A fluid drawing valve in a lower part of the second section of the agitating vessel was then opened, and under nitrogen pressure, the filtrate was drawn out. During that operation, the internal temperature of the agitating vessel was maintained at 12 to 16° C., and agitating was continued with the impeller positioned at a lowest level. In the course of the filtration, nitrogen gas was caused to flow backward at intervals of 15 minutes from a second section of the agitating vessel. When the resulting filter cake developed cracks, the impeller was moved up and down to spread and agitate the filter cake, and the precipitation and filtration steps were completed.

The fluid drawing valve was next closed, and methanol (600 kg) maintained at 15° C. and MEK (90 kg) were charged. After agitating the contents for 30 minutes, the fluid drawing valve was opened and under nitrogen pressure, the filtrate was drawn out. Temperature control and operations such as agitating, nitrogen gas back flow and spreading were performed as in the precipitation and filtration steps. Those operations were repeated again, so that the washing and filtration steps were conducted twice in total.

MEK (180 kg) was then charged to dissolve the filter cake, and the fluid drawing valve was opened to draw out an MEK solution. After the thus-obtained MEK solution was caused to pass through "Zeta Plus™ EC Series (40QSH)" (product of CUNO Incorporated) and "PhotoSHIELD™" (product of CUNO Incorporated), the MEK solution was fed to a solvent substitution tank equipped with a condenser. While distilling off light fractions with heating under reduced pressure, propylene glycol methyl ether acetate (hereinafter abbreviated as "PGMEA") was charged to prepare a PGMEA solution of 25 wt. % solid concentration.

The Mw and Mw/Mn of the thus-obtained copolymer were 10,000 and 1.70, respectively, and as its copolymer composition, NLM/MAM was 50/50 (mole %). Further, the time required for the purification steps (the precipitation and filtration steps once and the washing and filtration steps twice) was 10 hours. The results of an analysis of the copolymer in the PGMEA solution and the times required for the individual steps are presented in Table 1.

Example 2

The procedures of Example 1 were repeated likewise except that in each of the precipitation and filtration steps and the washing and filtration steps, the temperature of methanol was maintained at 5° C. and the temperature was controlled at 3 to 6° C. The results are presented in Table 1.

Example 3

The procedures of Example 1 were repeated likewise except that in each of the precipitation and filtration steps and the washing and filtration steps, the temperature of methanol was maintained at 30° C. and the temperature was controlled at 28 to 31° C. The results are presented in Table 1.

Referential Example 1

The procedures of Example 1 were repeated likewise except that in each of the precipitation and filtration steps and the washing and filtration steps, the filtration was conducted without causing nitrogen gas to flow backward. The results are presented in Table 1.

Referential Example 2

The procedures of Example 1 were repeated likewise except that in each filtration, spreading of a filter cake was not conducted. The results are presented in Table 1.

Referential Example 3

The procedures of Example 1 were repeated likewise except that in each filtration, neither agitating of a slurry nor spreading of a filter cake was conducted. The results are presented in Table 1.

Referential Example 4

The procedures of Example 1 were repeated likewise except that in each of the precipitation and filtration steps and the washing and filtration steps, the temperature of methanol was maintained at −5° C. and the temperature was controlled at −3 to −8° C. The results are presented in Table 1.

Referential Example 5

The procedures of Example 1 were repeated likewise except that in each of the precipitation and filtration steps and the washing and filtration steps, the temperature of methanol was maintained at 45° C. and the temperature was controlled at 42 to 47° C. The results are presented in Table 1.

Comparative Example 1

Into a tank equipped with Pfaudler impeller but no filter medium and having 1,200 liters internal capacity, methanol (700 kg) controlled at 15° C. was charged. Into the methanol, a polymerization reaction mixture obtained by a similar polymerization operation as in Example 1 was fed at a constant rate over 30 minutes such that a solid was precipitated to afford a white slurry. After completion of the feeding, agitating was continued as was for 30 minutes.

The contents were then transferred into a filtration tank having a filter area of 1 m$^2$, in which a polyester-made filter fabric having 3.5 cm$^3$/cm$^2$·sec air permeability was put up. Filtration was then conducted while maintaining the downstream side under reduced pressure, and the precipitation and filtration steps were completed. As no temperature control was feasible during the filtration, the temperature inside the filtration tank dropped to 3° C.

The resultant filter cake was then drawn out, and charged into a tank equipped with Pfaulder impeller but no filter medium. In the tank, methanol (600 kg) maintained at 15° C. and MEK (90 kg) had been placed beforehand. Subsequent to agitating for 30 minutes, the contents were transferred into a filtration tank which was equipped with neither agitating means nor a temperature-controlling jacket, and was subjected to filtration while maintaining the downstream side under reduced pressure. Those operations (washing and filtration steps) were conducted twice in total. The thus-obtained filter cake was treated in a similar manner as in Example 1. The results are presented in Table 1.

Comparative Example 2

The procedures of Comparative Example 1 were repeated likewise except that only the precipitation and filtration steps were conducted and the washing and filtration steps were not performed. The results are presented in Table 1.

TABLE 1

| | | Temperature (° C.) | | | | | | Composition & molecular weight of copolymer | | | | Results | | |
|---|---|---|---|---|---|---|---|---|---|---|---|---|---|---|
| | | Precipitat'n & filtrat'n steps | | Washing & filtrat'n steps (1) | | Washing & filtrat'n steps (2) | | Ave. composit'n (mole %) | | | | Concent. of resid. monomers | Purifi- ca'n yield | Total working time |
| No. | Remarks | Precipita- t'n max | Filtra- t'n min | Wash- ing max | Filtra- t'n min | Wash- ing max | Filtra- t'n min | NLM | MAM | Mw | Mw/Mn | (wt. %) | (wt. %) | (hr) |
| Ex. 1 | — | 16 | 12 | 16 | 13 | 16 | 13 | 50 | 50 | 10.0 | 1.70 | 0.03 | 80% | 10 |
| Ex. 2 | — | 6 | 3 | 5 | 4 | 5 | 4 | 50 | 50 | 9.7 | 1.78 | 0.05 | 83% | 10 |
| Ex. 3 | — | 31 | 28 | 31 | 28 | 30 | 29 | 50 | 50 | 10.3 | 1.63 | 0.01 | 75% | 10 |
| Ref. Ex. 1 | No backwash | 16 | 12 | 16 | 13 | 16 | 13 | 50 | 50 | 10.0 | 1.71 | 0.06 | 81% | 24 |
| Ref. Ex. 2 | No spreading | 16 | 12 | 16 | 13 | 16 | 13 | 50 | 50 | 10.0 | 1.71 | 0.10 | 80% | 10 |
| Ref. Ex. 3 | Standstill | 16 | 12 | 16 | 13 | 16 | 13 | 50 | 50 | 10.0 | 1.71 | 0.10 | 81% | 24 |
| Ref. Ex. 4 | Low temp. | −3 | −8 | −4 | −6 | −4 | −6 | 50 | 50 | 9.5 | 1.81 | 0.30 | 85% | 10 |
| Ref. Ex. 5 | High temp. | 47 | 42 | 46 | 43 | 46 | 44 | 50 | 50 | 11.0 | 1.49 | 0.00 | 67% | 10 |
| Comp. Ex. 1 | Different equipment | 15 | 3 | 16 | 5 | 16 | 5 | 50 | 50 | 9.8 | 1.75 | 0.07 | 76% | 72 |
| Comp. Ex. 2 | Different equipment | 15 | 3 | ... | ... | ... | ... | 50 | 50 | 9.5 | 1.83 | 3.50 | 86% | 12 |

From the above-described results, it is understood that the purification processes according to the present invention can efficiently remove unreacted monomers and the like in an extremely short working time compared with the purification processes making combined use of a conventional agitating tank and filtration tank. It is also understood that the properties of each copolymer after its purification had been affected significantly by its purification temperature. Referential Examples 1-3 demonstrate that washing by a backwash gas or agitating and spreading by agitating means is effective for the efficient removal of monomers and also for shortening the filtration time. Referential Examples 4 and 5 demonstrate that an unduly low purification temperature results in insufficient removal of unreacted monomers while an excessively high purification temperature leads to a deterioration in the yield of a copolymer upon purification.

According to the present invention, the precipitation and washing steps of a copolymer for semiconductor lithography can be conducted in a hermetically-closed single vessel. It is, therefore, possible to avoid contamination from the outside and also to rationalize the equipment and to improve the efficiency of work. In addition, the filtration time can be considerably shortened. Moreover, impurities such as unreacted monomers can be efficiently removed, and by controlling the temperature, the copolymer for semiconductor lithography can be obtained with stable quality and little lot-to-lot variations in the amount of impurities. Accordingly, the copolymer can be applied as a polymer for resists, a polymer for anti-reflective coatings, a polymer for low layers in multilayer resists, and so on, and can achieve improved performance in the fabrication of semiconductors.

This application claims the priority of Japanese Patent Application 2003-371089 filed Oct. 30, 2003, which is incorporated herein by reference.

The invention claimed is:

1. A process of producing a copolymer in which a polymerizable monomer comprising at least recurring units of substituted (meth)acrylate, is subjected to radical polymerization with a polymerization initiator dissolved in an organic polymerization solvent, thereby obtaining a polymerization reaction mixture that comprises a product copolymer; and recovery of said product copolymer is carried out with a single hermetically-closed vessel divided by a filter medium into a first section into which the polymerization reaction mixture is introduced and agitated and a second section from which a filtrate is discharged from the vessel, said process comprising:
   (1) introducing said polymerization reaction mixture into said first section which comprises a poor solvent for said copolymer, and precipitating solid copolymer from said polymerization reaction mixture;
   (2) filtering the contents in said first section, which comprises the polymerization reaction mixture, the poor solvent, and the precipitated solid copolymer through said filter medium, thereby removing the filtrate from said precipitated solid copolymer, and recovering the precipitated solid copolymer on the filter medium;
   wherein said copolymer possesses a chemical structure which causes its solubility in alkaline water to vary by the action of an acid.

2. The process according to claim 1, further comprising the following steps (3) and (4), respectively, after said step (2):
   (3) introducing a poor solvent or mixed solvent of a poor solvent and a good solvent into said first section of said vessel and dispersing and washing said solid copolymer recovered on the filter medium with agitation; and
   (4) filtering the contents in said first section, which comprises the poor solvent or the mixed solvent of a poor solvent and a good solvent, and solid copolymer through the filter medium, thereby removing the filtrate from the solid copolymer and recovering the washed solid copolymer on said filter medium.

3. The process according to claim 2, wherein at least one of said steps (1) and (2) and said steps (3) and (4) are conducted at a temperature ranging from 0 to 40° C.

4. The process according to claim 2, wherein temperature variations during each step in at least one of said steps (1) and (2) and said steps (3) and (4) are controlled within 10° C.

5. The process according to claim 1 or 2, wherein the contents in said vessel are agitated by an impeller, and in each of steps (2) and (4), said filtration is conducted while agitating contents in said vessel by said impeller.

6. The process according to claim 1 or 2, wherein, in each of steps (2) and (4), a filter cake of said solid copolymer is spread by an impeller on said filter medium.

7. The process according to claim 1 or 2, wherein during each of steps (2) and (4), the filtered solvent or a gas is forced to flow backward from said second section of said vessel into said first section of said vessel such that deposit on said filter medium is separated from said filter medium.

8. The process according to claim 1, wherein said filter medium is selected from the group consisting of a fabric formed of synthetic fiber selected from the group consisting of polyesters, nylon, polyolefins, aramids, acrylic resins, polytetrafluoroethylene, polyphenylene sulfide and polyimides, a fabric formed of glass fibers and a sintered metal.

9. The process according to claim 1, wherein said filter medium has a permeability ranging from 0.1 to 300 $cm^3/cm^2 \cdot sec$.

10. The process according to claim 1, wherein after step (2),
   (5) discharging the filtrate from the vessel from said second section; and
   (6) adding a good solvent to said precipitated solid copolymer to dissolve the same, whereby said copolymer is recovered as a solution.

11. The process according to claim 2, wherein after step (4),
   (5) discharging the filtrate from the vessel from said second section; and
   (6) adding a good solvent to said precipitated solid copolymer to dissolve the same, whereby said copolymer is recovered as a solution.

12. The process according to claim 1, wherein the recurring units of substituted (meth)acrylate comprise units selected from the group consisting of substituted and unsubstituted phenyl(meth)acrylate units, naphthalenyl(meth)acrylate units, and anthracenyl (meth)acrylate units.

13. The process according to claim 10, wherein said copolymer solution from step (6) is passed through a filter having an average pore diameter not greater than 0.5 µm, and then, said copolymer solution is recovered.

* * * * *